US005596610A

United States Patent [19]

Leung et al.

[11] Patent Number: 5,596,610
[45] Date of Patent: Jan. 21, 1997

[54] DELAY STAGE CIRCUITRY FOR A RING OSCILLATOR

[75] Inventors: Wingyu Leung, Cupertino; Mark A. Horowitz, Mountain View, both of Calif.

[73] Assignee: Rambus, Inc., Mountain View, Calif.

[21] Appl. No.: 347,844

[22] Filed: Dec. 1, 1994

Related U.S. Application Data

[60] Continuation of Ser. No. 161,769, Dec. 2, 1993, abandoned, which is a division of Ser. No. 890,034, May 28, 1992, abandoned.

[51] Int. Cl.⁶ .................................................. H03D 3/24
[52] U.S. Cl. .................... 375/376; 375/377; 330/253; 330/261; 330/277; 327/287; 327/288
[58] Field of Search ............................. 375/371–376, 375/377; 330/252, 253, 257, 261, 277, 280, 288; 331/57, 108 AB; 333/138, 164; 327/208, 210, 214, 220, 246, 247, 264, 266, 272, 274, 278, 280, 281, 285–288

[56] References Cited

U.S. PATENT DOCUMENTS

| | | | |
|---|---|---|---|
| 4,099,266 | 7/1978 | Biggers | 307/270 |
| 4,247,817 | 1/1981 | Heller | 324/73 |
| 4,481,625 | 11/1984 | Roberts et al. | 370/85 |
| 4,519,034 | 5/1985 | Smith et al. | 364/200 |
| 4,600,943 | 7/1986 | Tanabe | 358/147 |
| 4,785,394 | 11/1988 | Fischer | 364/200 |
| 4,808,944 | 2/1989 | Taylor | 330/253 |
| 4,811,202 | 3/1989 | Schabowski | 364/200 |
| 4,841,551 | 7/1989 | Avaneas | 375/372 |
| 4,859,970 | 8/1989 | Matsuo et al. | 331/57 |
| 4,860,198 | 8/1989 | Takenaka | 364/200 |
| 4,888,729 | 12/1989 | Nelson | 364/900 |
| 4,893,095 | 1/1990 | Thommen | 331/57 |
| 5,010,303 | 4/1991 | Braun | 330/257 |
| 5,036,528 | 7/1991 | Costantino et al. | 375/373 |
| 5,095,284 | 3/1992 | Mead | 330/253 |
| 5,142,244 | 8/1992 | Glica et al. | 330/253 |
| 5,180,994 | 1/1993 | Martin et al. | 331/38 |
| 5,182,525 | 1/1993 | Theus | 330/253 |
| 5,191,301 | 3/1993 | Mullgrav, Jr. | 331/57 |
| 5,198,780 | 3/1993 | Kase | 330/253 |
| 5,206,550 | 4/1993 | Mehta | 307/530 |
| 5,206,609 | 4/1993 | Mijuskovic | 331/57 |
| 5,210,236 | 5/1993 | Takayanagi | 330/253 |

(List continued on next page.)

FOREIGN PATENT DOCUMENTS

WO9116680  10/1991  European Pat. Off. ........ G06F 13/16

OTHER PUBLICATIONS

Donald L. Schilling et al, *Electronics Circuit* 3rd edition, "Introduction to the Theory of Operation of the FET", p. 139, 1989.

Stanley G. Burns et al, Principles of Electronics Circuits, "Differential Amplifier with Active Loading", 1987, pp. 554–559.

*Primary Examiner*—Stephen Chin
*Assistant Examiner*—Amanda T. Le
*Attorney, Agent, or Firm*—Blakely, Sokoloff, Taylor & Zafman, L.L.P.

[57] ABSTRACT

A delay stage for a ring oscillator supplies a first output signal and a second output signal. Each of the first and second output signals has a peak-to-peak voltage swing. The first and second output signals are complementary to each other. The delay stage includes a differential amplifier for generating the first output signal and the second output signal and a voltage clamping circuit for limiting the peak-to-peak voltage swing of the first and second output signals. The voltage clamping circuit is coupled between the first output signal and the second output signal. The differential amplifier includes a first NMOS transistor and a second NMOS transistor for generating the first and second output signals. The differential amplifier also includes a first PMOS transistor and a second PMOS transistor coupled to (1) the first and second NMOS transistors and (2) the voltage clamping circuit for providing bias currents to the first and second NMOS transistors.

4 Claims, 14 Drawing Sheets

U.S. PATENT DOCUMENTS

| | | | |
|---|---|---|---|
| 5,239,274 | 8/1995 | Chi | 331/57 |
| 5,245,637 | 9/1993 | Gersbach et al. | 375/373 |
| 5,285,173 | 2/1994 | Reynolds | 331/57 |
| 5,298,870 | 5/1994 | Cytera et al. | 331/45 |
| 5,300,898 | 7/1994 | Chen et al. | 331/57 |
| 5,446,418 | 8/1995 | Hara et al. | |

FIG_1

FIG_2

FIG_3

FIG_4

FIG_6

FIG_7

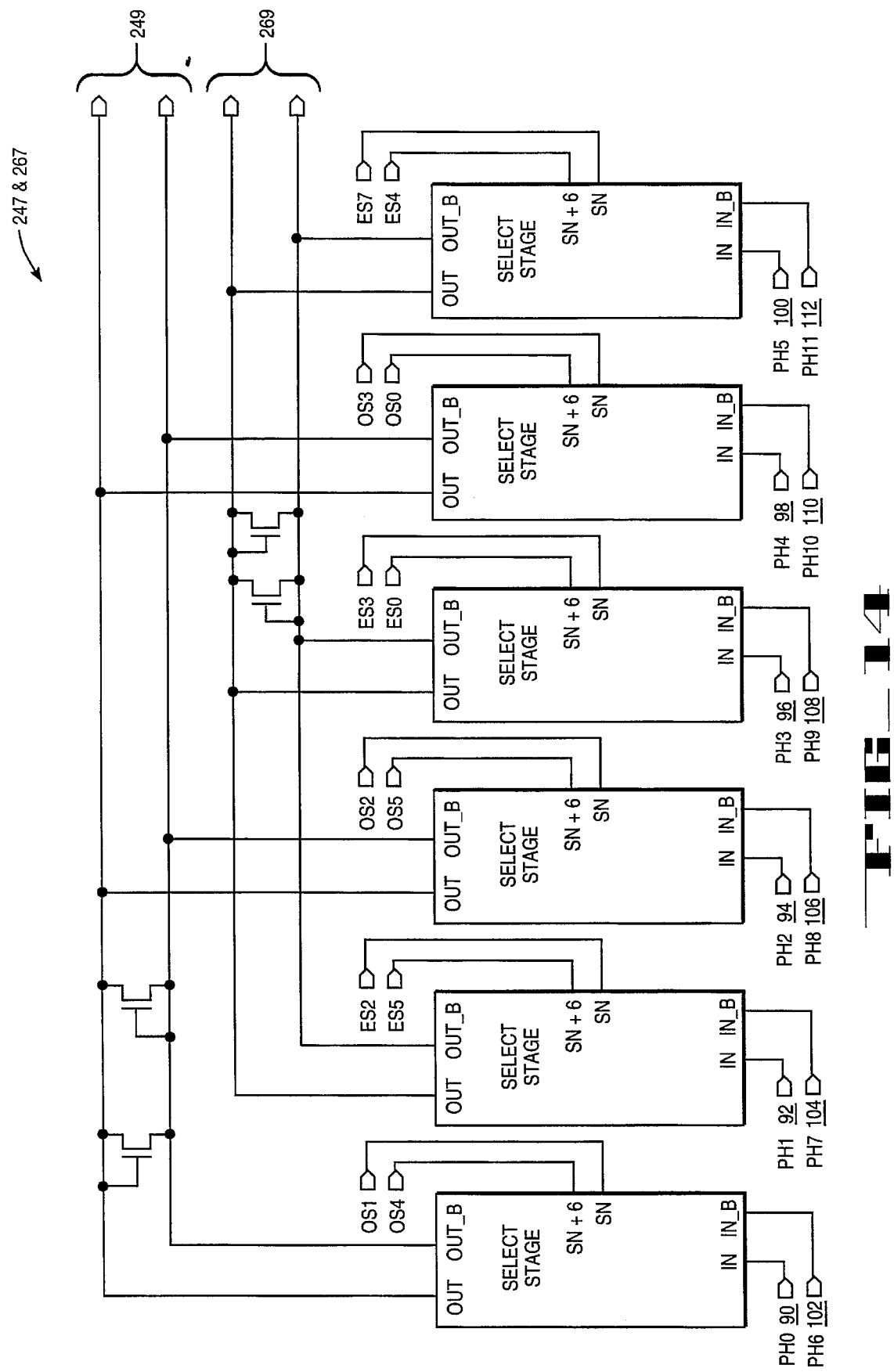

5,596,610

DELAY STAGE CIRCUITRY FOR A RING OSCILLATOR

This is a continuation of application Ser. No. 08/161,769, filed Dec. 2, 1993, abn, which is a divisional of application Ser. No. 07/890,034, filed May 28, 1992, abn.

FIELD OF INVENTION

The present invention relates to clock synchronization circuitry including a cascaded phase locked loop. In particular the present invention relates to a delay stage for a ring oscillator and a fine phase tuning circuitry, both used in the cascaded phase locked loop.

BACKGROUND OF THE INVENTION

Clock synchronization in integrated circuits is typically performed by a phase locked loop (PLL).

Some prior PLLs use a ring oscillator as a voltage controlled oscillator. A ring oscillator is a chain of inversion elements coupled together in a negative feedback fashion, with each element contributing a delay amount which adds up to half an oscillation period. Some prior phase locked loop implementations using ring oscillators suffer phase offset and deadband problems, which are difficult to minimize without compromising one or the other.

One disadvantage of prior ring oscillators is that the number of phase signals that can be generated are limited by the number of inversion elements contained in the ring oscillator. The number of inversion elements is, in turn, limited by the length of time delay contributed by each inversion element. The greater the time delay of the inversion element, the fewer the number of inversion elements that can be included in the ring oscillator.

Another disadvantage of some prior oscillators is that they must include an odd number of inversion elements to develop a phase shift of greater than 180°.

Other prior PLLs use voltage controlled delay line to generate the phase shift necessary for oscillation. Such prior PLLs have a limited delay range, typically a clock period or less. Hence, the frequency of operation of such prior PLLs is very limited. Prior PLLs including delay lines also tend to be susceptible to supply noise because of their use of CMOS inverters, which couple supply noise directly into output signals.

SUMMARY AND OBJECTS OF THE INVENTION

One object of the present invention is to provide a method and circuitry for synchronizing internal device functions to an external clock.

Another object of the present invention is to provide a method and circuitry for clock synchronization that allows phase deadband characteristics to be easily optimized.

Another object of the present invention is to provide a method and circuitry for clock synchronization that allows easy optimization of stability characteristics.

Another object of the present invention is to provide a method and circuitry for clock synchronization that minimizes the affect of the delay of clock buffers.

Another object of the present invention is to provide a method and circuitry for clock synchronization that minimizes the affect of a clock distribution network on loop stability.

A still further object of the present invention is to provide a method and circuitry for clock synchronization that allows easy optimization of loop bandwidth.

A further object of the present invention is to provide a method and circuitry for clock synchronization that provides high rejection of power supply noise.

Another object of the present invention is to provide a method and circuitry for fine phase adjustment with small static phase error and high loop stability.

Another object of the present invention is to provide a method and circuitry for phase adjustment in which there are no boundary conditions or start up conditions to be concerned with.

Another object of the present invention is to provide a method and circuitry for clock synchronization that provides smooth phase adjustment.

Another object of the present invention is to provide a method and circuitry for clock synchronization that is suitable for a wide range of frequencies.

Another object of the present invention is to provide a method and circuitry for clock synchronization that minimizes restart response time after power down.

Another object of the present invention is to provide a method and circuitry for clock synchronization that compensates for the delays associated with data input circuitry and data output circuitry.

A still further object of the present invention is to provide a method and circuitry for clock synchronization that generates an output signal with an controlled phase offset with respect to the input reference signal.

A method of performing phase adjustment in a phase locked loop is described. First, two phase signals are selected from a multiplicity of phase signals. The two selected phase signals are selected by a select signal. Next, an output signal is generated by interpolating between the two selected phase signals. The contribution of each of the two selected phase signals to the output signal is determined by a weighting signal.

Also described is phase tuning circuitry, which includes a phase selector and a phase interpolator. The phase selector selects two phase signals from a multiplicity of phase signals in response to a select signal. The two selected phase signals are coupled to the phase interpolator. The phase interpolator generates an output signal by interpolating between the two selected phase signals. The relative contribution of each of the two selected phase signals to the output signal is determined by a weighting signal.

Also described is a delay stage for a ring oscillator. The ring oscillator includes an even number of cascaded delay stages. Each delay stage includes a differential amplifier, which generates two complementary output signals. Coupled between the complementary output signals, two voltage clamping means limit the peak-to-peak voltage swing of the output signal. Limiting the peak-to-peak voltage swing of the output signal speeds-up the delay stage and allows the ring oscillator to include a greater number of delay stages.

Other objects, features, and advantages of the present invention will be apparent from the accompanying drawings and the detailed description that follows:

BRIEF DESCRIPTION OF THE DRAWINGS

The present invention is illustrated by way of example and not limitation in the figures of the accompanying drawings in which like references indicate similar elements and in which:

FIG. 9 is a block diagram of the even multiplexer and the odd multiplexer.

FIG. 14 is a block diagram of the out-of-phase even multiplexer and the out-of-phase odd multiplexer.

DETAILED DESCRIPTION

Figure 1:
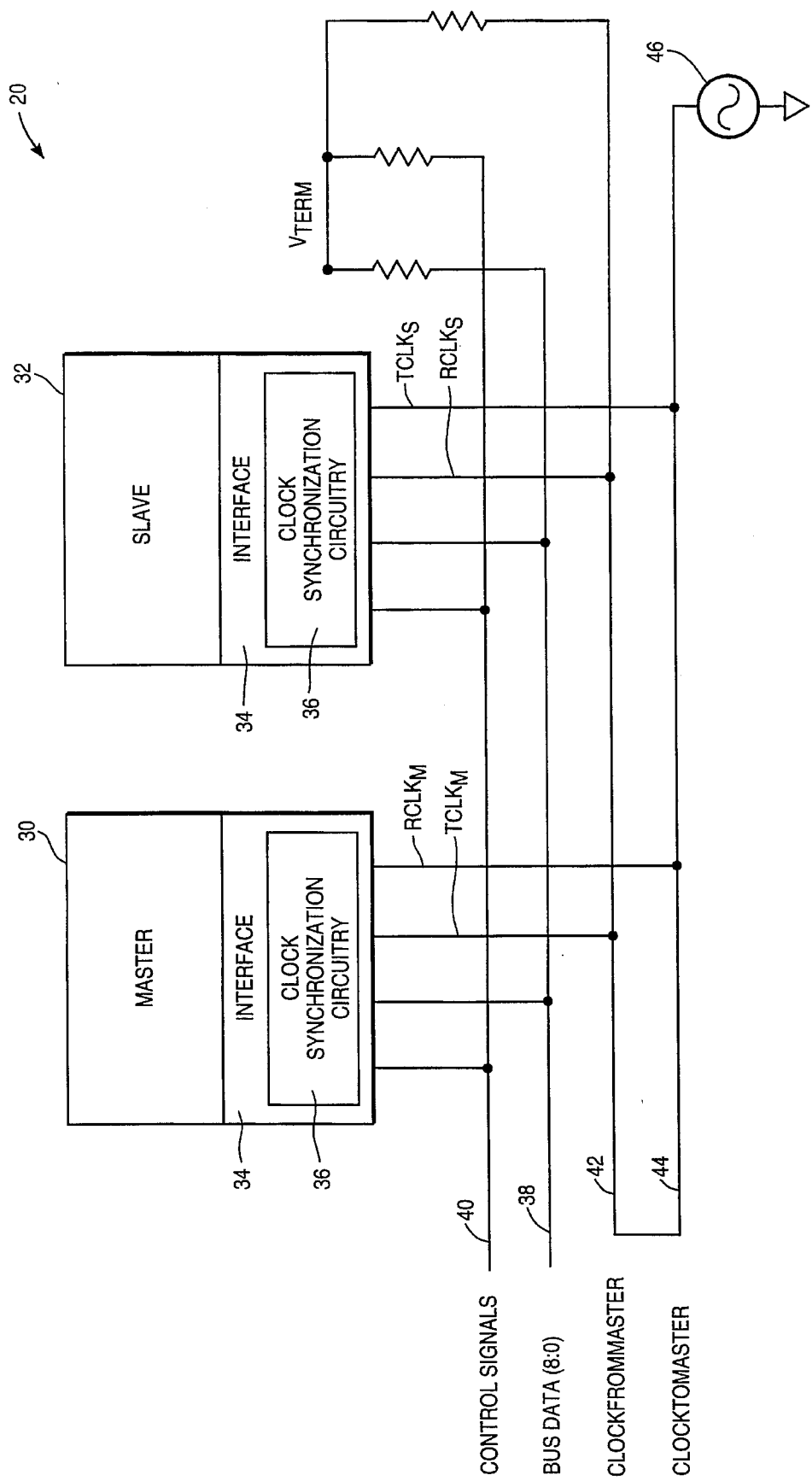
FIG. 1 is a block diagram of a high speed computer bus.

FIG. 1 is a block diagram of a high speed digital computer bus system 20. Devices 30 and 32 use clock synchronization circuitry 36 to synchronize the transfer of data between data bus 38. Clock synchronization circuitry 36 is a cascaded phase locked loop (PLL) 36. The main loop of PLL 36 utilizes a ring voltage controlled oscillator (VCO), which includes an even number of cascaded delay stages of the present invention. Two subloops coupled to the main loop perform fine phase tuning according to the method and circuitry of the present invention to generate two internal clock signals.

As will be described in more detail below, each delay stage of the present invention generates two complementary output signals using a differential amplifier. Coupled between the two complementary output signals, two clamping devices limit the peak-to-peak voltage swing of the complementary output signals. When the delay stages are cascaded together, they provide twelve different phase signals that are used by the subloops.

The method and circuitry for fine phase adjustment used in the subloops also will be described in detail below. Briefly described, the phase tuning circuitry of the present invention includes a phase selector and a phase interpolator. The phase selector selects an even phase signal and an odd phase signal from the twelve phase signals output by the VCO of the main loop. The even and odd phase signals are selected by an even select signal and an odd select signal, respectively. The phase interpolator interpolates between the even phase signal and the odd phase signal to generate an output signal. The effect of the even phase signal and the odd phase signal on the output signal is determined by an even weighting signal and an odd weighting signal, respectively. The weighting signals allow even phase signals and odd phase signals to switch without introducing jitter onto the output signal.

The high speed digital computer bus system 20 of FIG. 1 includes master device 30, slave devices 92, only one Of which is shown, and data bus 38. Data bus 38 transfers data between devices 30 and 32 at data rates up to 500 MBytes per second, in the preferred embodiment.

Master device 30 is an intelligent device, such as a microprocessor, an application specific integrated circuit (ASIC), a memory controller, or a graphics engine. Master 30 differs from slave device 32 in that master device 30 initiates data requests, such as requests to read or write slave devices 32.

Slave devices 32 do not include as much intelligence as master device 30 and can only respond to data requests. Slave devices 32 may be dynamic random access memories (DRAMs), static random access memories (SRAMs), read only memories (ROMs), electrically programmable read only memories (EPROMs), or flash memories.

Master device 30 and slave devices 32 transfer data synchronously. That is, data transfers are referenced to the clock edges of clock signals CLOCKFROMMASTER 42 and CLOCKTOMASTER 44. Both clock signals 42 and 44 are generated by clock source 46. Both clock signals 42 and 44 are carded by a single clockline, which turns around near master device 30. From there, the clockline extends back toward clock source 46, where it is terminated. As a result, both CLOCKFROMMASTER 42 and CLOCKTOMASTER 44 run at the same frequency. The phase shift between clock signals 42 and 44 varies depending upon the location of devices 30 and 32 relative to the turnaround in the clockline. The phase difference between clock signals 42 and 44 is approximately 0° near the turnaround and increases as distance from the turnaround increases.

Slave devices 32 transmit data with the edges of CLOCKTOMASTER 44 and receive data with CLOCKFROMMASTER 42. Analogously, master device 30 transmits data with the edges of CLOCKFROMMASTER 42 and receives data with CLOCKTOMASTER 44. Clock and data signals remain synchronized as they propagate toward their destination because clock lines 42 and 44 and data bus 38 are matched for delay.

Devices 30 and 32 interface with data bus 38 and clock signals 42 and 44 using interface 34. Interface 34 performs a number of tasks. Among those tasks, interface 34 converts the low voltage levels of data bus 38 to ordinary CMOS levels. Interface 34 also generates internal clocks for receiving and transmitting data. Interface 34 uses clock synchronization circuitry 36 to perform voltage level conversion and clock synchronization.

Figure 2:
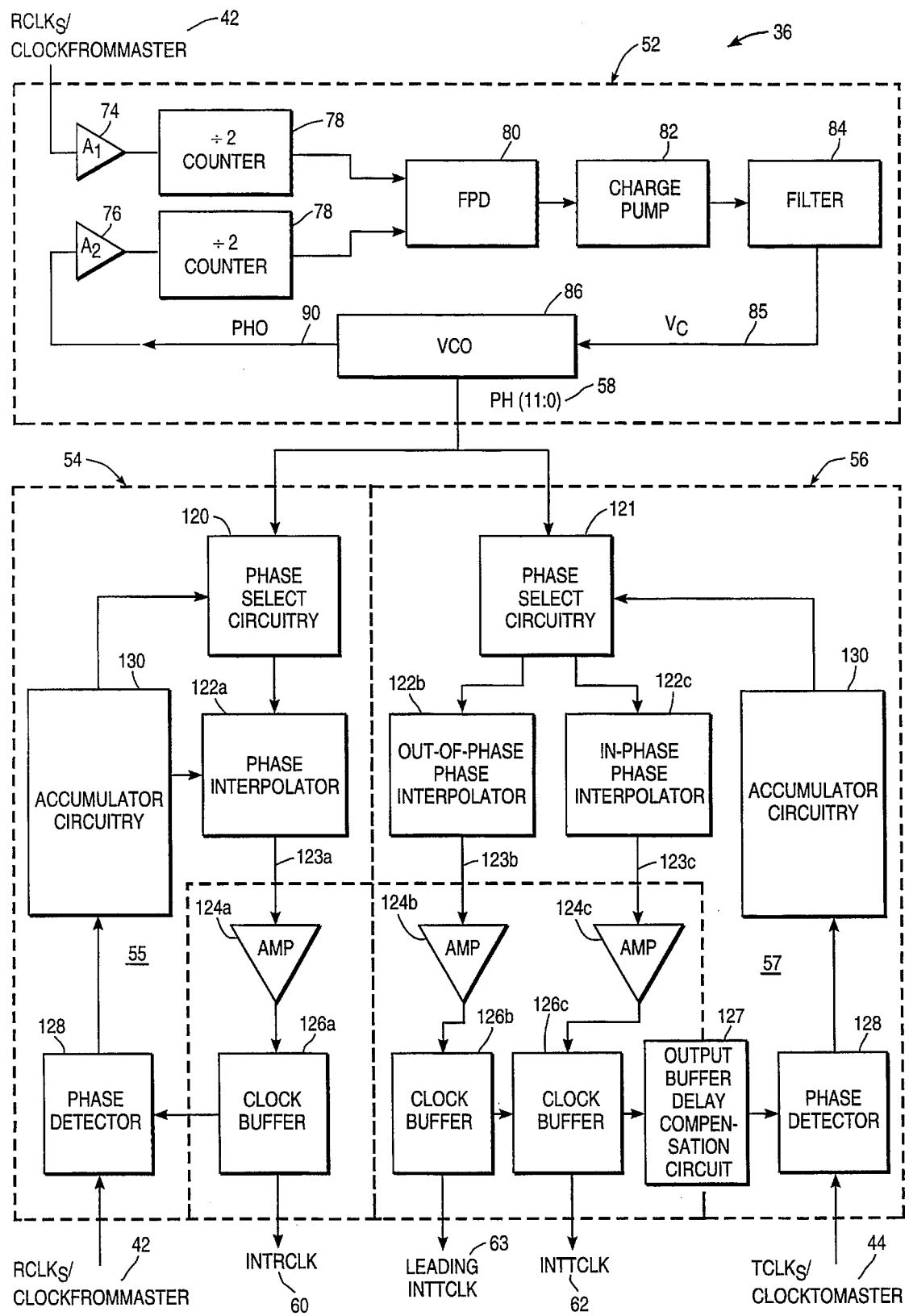
FIG. 2 is a block diagram of a phase locked loop.

FIG. 2 illustrates in block diagram form clock synchronization circuitry 36 that is the heart of interface 34. Phase locked loop 36 synchronizes the reception of data to the device's external receive clock, CLOCKTOMASTER 44 or CLOCKFROMMASTER 42, as the case may be. Similarly, phase locked loop 36 synchronizes the transmission of data with the device's external transmit clock, CLOCKTOMASTER 44 or CLOCKFROMMASTER 42, as the case may be.

Phase locked loop 36 performs both synchronization tasks using a cascaded design, which includes main loop 52 and two subloops, a receive subloop 54 and a transmit subloop 56. Main loop 52 acquires and tracks frequency, outputting 12 phase signals, PH(11:0) 58, all with the same frequency, to subloops 54 and 56. Subloops 54 and 56 perform fine phase tracking of clock signals 42 and 44 by selecting two phase signals from PH(11:0) 58. The two selected phase signals are interpolated to generate internal receive and transmit clock signals, INTRCLK 60, INTTCLK 62, and LEADING INTTCLK 63. INTRCLK 60 is in-phase with external receive clock 42. INTTCLK 62 is also in phase with its external reference clock signal, $TCLK_S$ 44. In contrast, LEADING INTTCLK 63 leads $TCLK_S$ 44 by 90° in a preferred embodiment.

Main loop 52 uses a conventional second order architecture to track and acquire signal frequencies ranging from 50 MHz to 250 MHz. Main loop 52 has a short pull in time of less than 10 usec. The amount of static phase error generated by main loop 52 has no affect upon the phase tracking accuracy of PLL 36 because subloops 54 and 56 perform phase acquisition. Thus, static phase error in main loop 52 may be, and is, traded for reduced deadband and improved stability characteristics. In contrast, the jitter of phase signals PH(11:0) 58 is minimized because it directly affects the jitter within subloops 54 and 56.

Optimization of the stability of phase signals PH(11:0) 58 is further aided by the cascaded design of PLL 36. Clock distribution and buffering is performed by subloops 54 and 56, rather than main loop 52. Thus, main loop stability is unaffected by buffer and clock distribution delay. Consequently, main loop bandwidth may be easily optimized and the size of filter 82 reduced. This is particularly important in embodiments in which filter 84 and all of PLL 36 is fabricated on a single one.

Main loop 52 includes amplifiers 74 and 76, counters 78, frequency-phase detector (FPD) 80, charge pump 82, filter 84, and voltage controlled oscillator (VCO) 86.

Amplifier 74 amplifies $RCLK_S$ to a voltage swing of 0 volts to 5 volts, as required by FPD 80. Amplifier 76 similarly amplifies PH0 90 to a voltage swing of 0 volts to 5 volts. The gain of amplifiers 74 and 76 necessarily differ because the voltage swings of $RCLK_S$ and PH0 90 differ. This difference in amplification prior to frequency and phase detection by FPD 80 introduces static phase error into main loop 52. The static phase error so introduced is tolerable because it does not affect the phase tuning of subloops 54 and 56.

Preferred implementations of phase locked loop 36 include counters 78 to increase the frequency range of PLL 36. Counters 78 divide the frequency of their inputs by two, prior to coupling their outputs to FPD 80. Counters 78 thus enhance the frequency response of FPD 80 by expanding the range of frequencies that FPD 80 can accommodate.

FPD 80 is a sequential frequency detector, selected for its large tracking range and short pull-in time.

Charge pump 82 converts the output of FPD 80 into current pulses. Charge pump 82 eliminates deadband with its high input sensitivity. Charge pump 82 introduces static phase error because its mechanisms for switching from a high-to-low output and from a low-to-high output am not symmetrical. This static phase error is tolerable because main loop 52 does not perform phase tuning. Thus, charge pump 82 may, and does, differ from prior charge pumps because within main loop 52 dead band characteristics may be reduced without concern for static phase error.

Filter 84 converts the current pulses into the analog control voltage 85 coupled to VCO 86 using a standard one-pole, one zero, passive filter.

VCO 86 is a six delay stage ring oscillator. Each delay stage generates two of the twelve phase signals, PH(11:0) 58. The differential design of the VCO stage provides high power-supply rejection (PSR), as well as complementary outputs.

Figure 3:
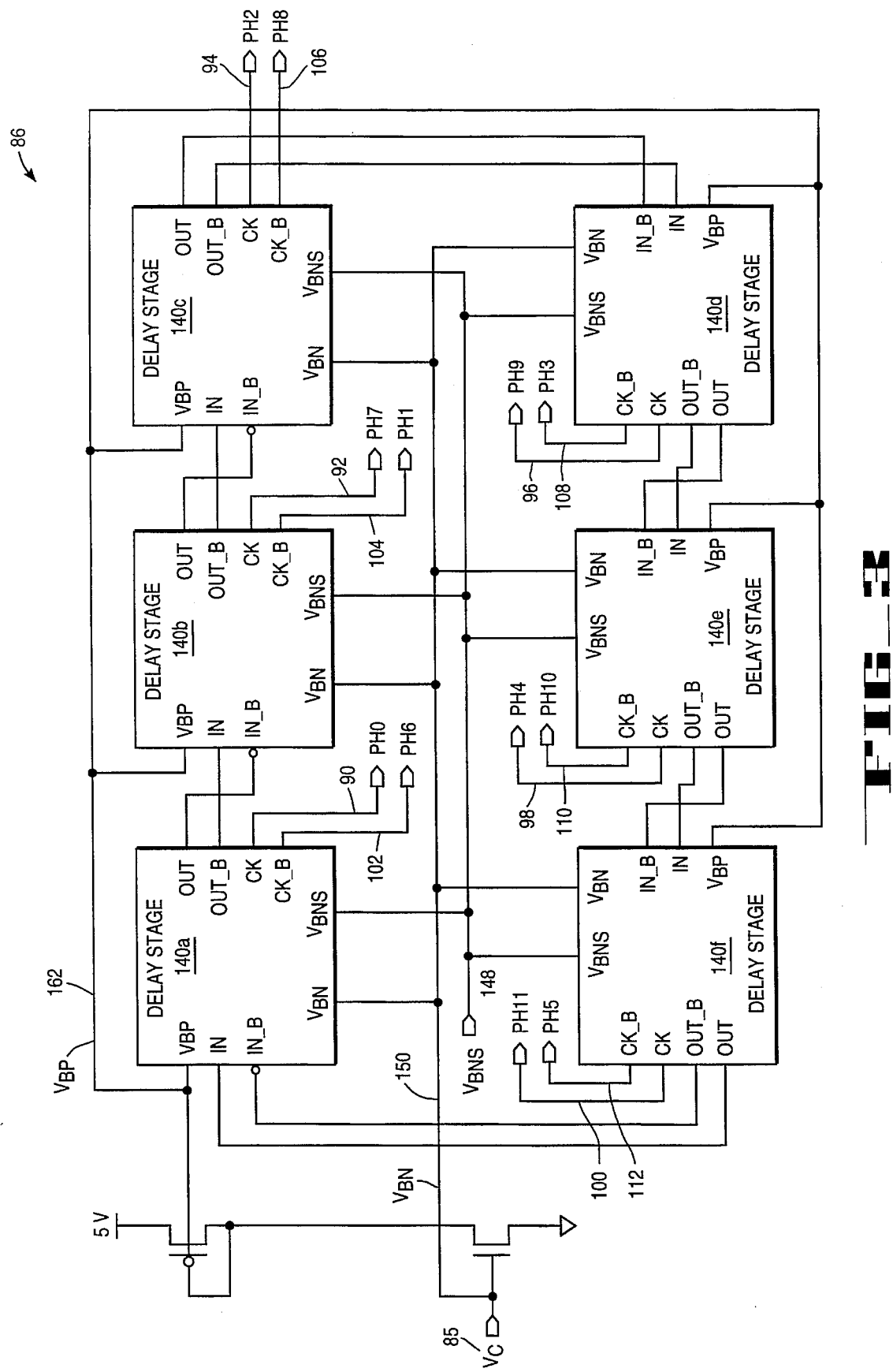
FIG. 3 is a block diagram of the VCO.

FIG. 3 illustrates in block diagram form ring voltage controlled oscillator 86. VCO 86 varies from previous ring oscillators in two respects. First, VCO 86 includes an even number of delay stages 140. VCO 86 is able to generate 180° phase shift with an even number of delay stages 140 because each delay stage 140 generates two complementary outputs that are appropriately coupled to the next delay stage. Second, VCO 86 includes a greater number of delay stages than normal. VCO 86 is able to include more delay stages because each delay stage 140 contributes less delay then prior delay stages.

Each delay stage 140a–140f of VCO 86 generates two pairs of complementary output signals, OUT and OUTB, and CK and CKB. CK and CKB are buffered, level shifted versions of OUT and OUTB. Thus, CK and CKB have the same voltage swings and frequencies as OUT and OUTB. The buffering of CK and CKB prevents their loading from affecting the stability of VCO 86.

Delay stages 140a–140f are coupled together via OUT and OUTB so that the entire phase shift from the input of delay stage 140a to the output of delay stage 140f is greater than or equal to 180° at the oscillation frequency. Outputs OUT of delay stages 140a–140e are coupled together to the INB inputs of the next delay stage 140b–140f. Outputs OUTB of delay stages 140a–140e are coupled to inputs IN of delay stages 140b–140f. Only the coupling between delay stages 140f and 140a varies from this pattern.

Outputs CK and CKB of each stage stage 140a–140f are coupled to subloops 54 and 56 as two of the twelve phases 58 output by VCO 86.

Control voltage, $V_c$ 85, controls the frequency at which each delay stage 140a–140f switches via bias voltage, $V_{BN}$ 160. $V_c$ 85 can vary between 3.5 volts to 0 volts, giving VCO 86 a wide locking range. $V_c$ 85 also ensures that phase signals PH(11:0) 58 have a symmetrical voltage swing via bias voltage, $V_{BP}$ 162.

Figure 4:
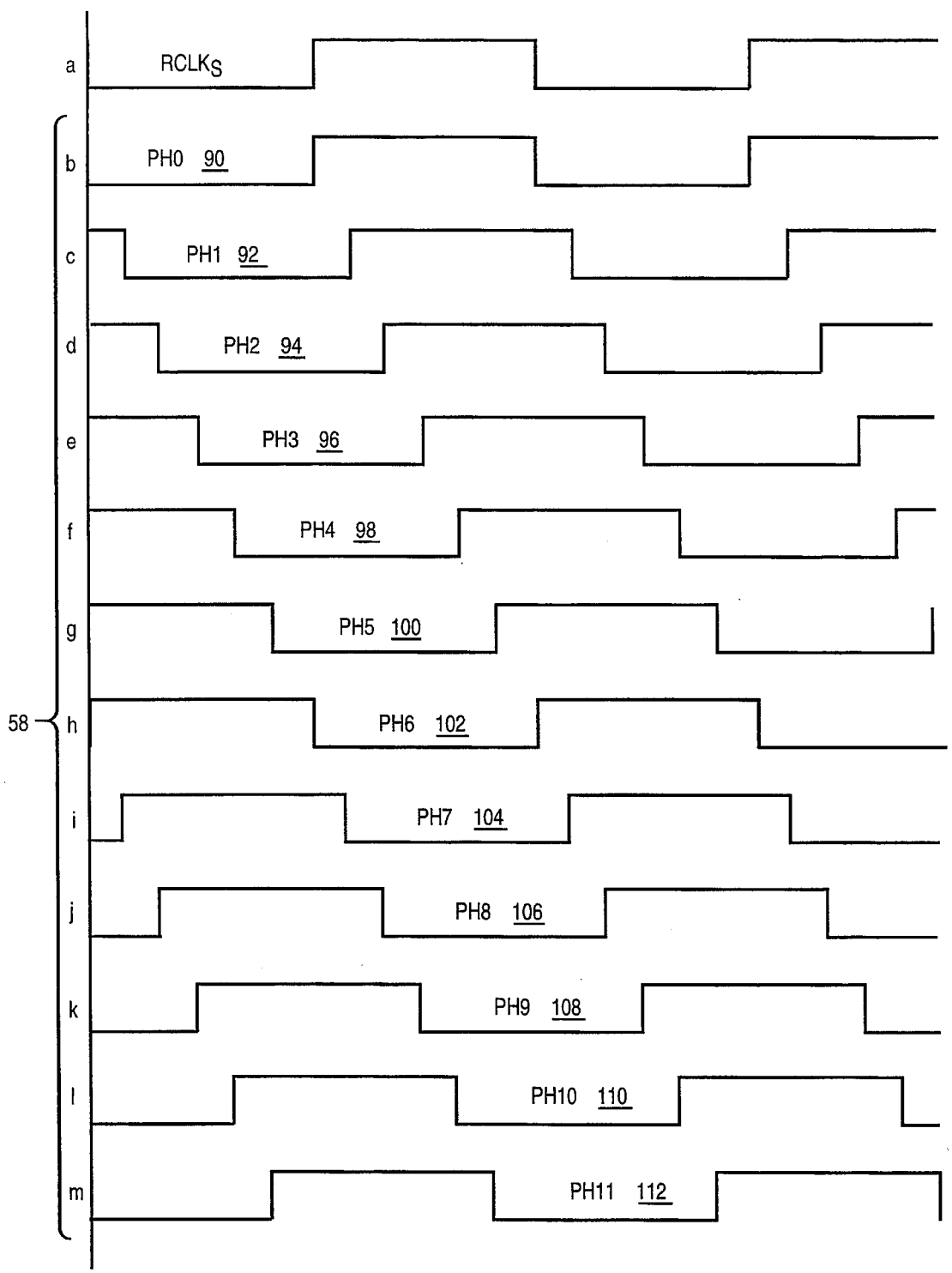
FIG. 4 is a diagram of the relationship between the external reference signal and the phase signals output by the VCO.

FIG. 4 illustrates the relationship between the twelve phase signals 58 generated by VCO 86. When PLL 36 is in lock PH0 90 should be in-phase with reference signal, $RCLK_S$, except for the static phase error contributed by amplifiers 74 and 76, and charge pump 82. The remaining phases, PH(11:1) 58, are evenly spaced across the clock period of $RCLK_S$.

The first stage of VCO 86, delay stage 140a, outputs PH0 90 and PH6 102. These signals may be referred to as PH0 and its complement or PH6 and its complement.

The second delay stage 140b generates PH1 92 and PH7 104. These signals are also referred to as PH1 and it complement or PH7 and its complement.

PH2 94 and PH8 106 are the outputs of the delay stage 140c. These signals are also referred to as PH2 and its complement or PH8 and its complement.

Complementary phase signals PH3 96 and PH9 108 are generated by delay stage 140d.

The fifth delay stage 140e generates the complementary phase signals PH4 98 and PH10 110.

Delay stage 140f generates PH5 100 and PH11 112. These signals are also referred to as PH5 and its complement or PH11 and its complement.

Figure 5:
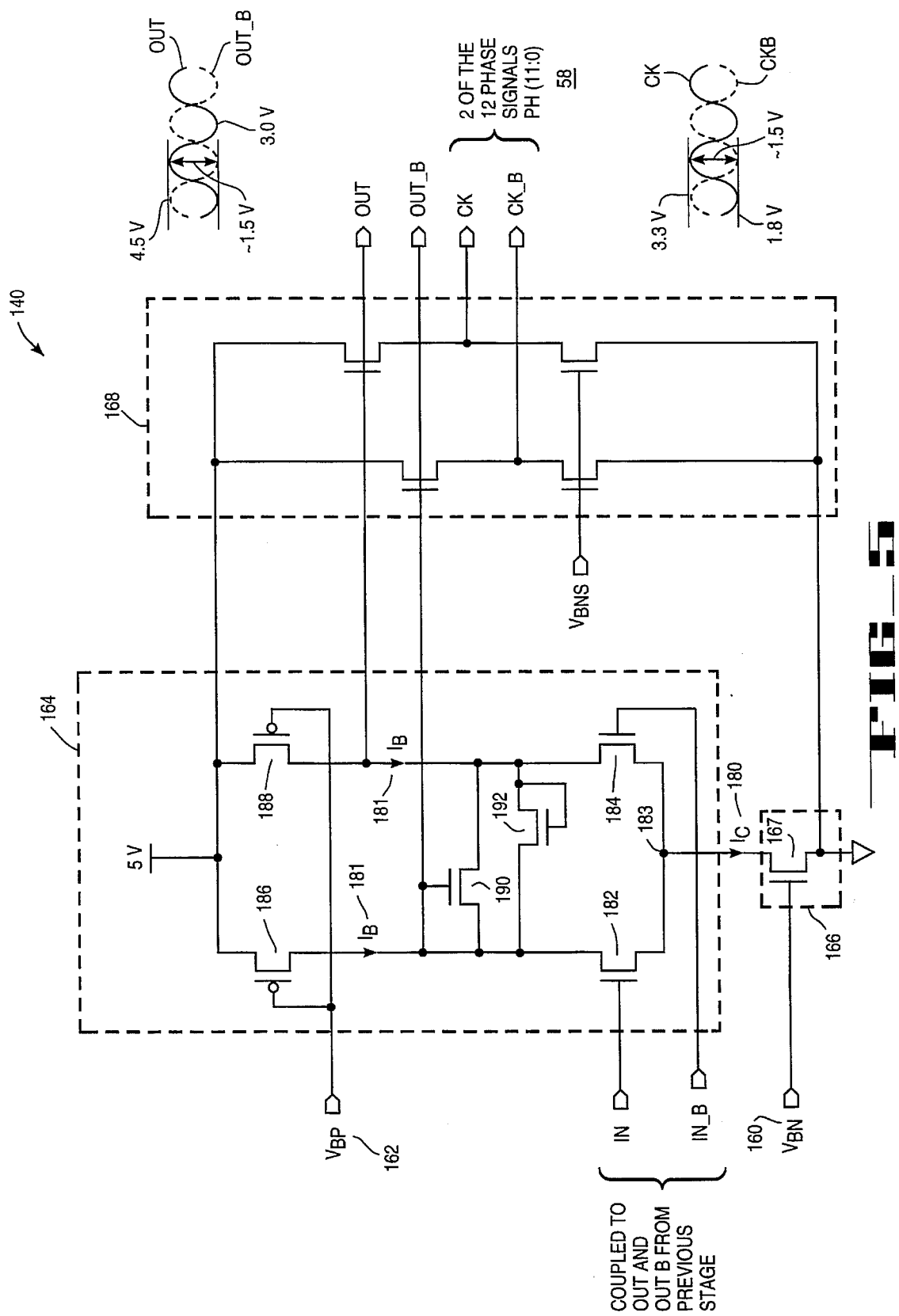
FIG. 5 is a schematic diagram of a delay stage of the VCO.

FIG. 5 is a schematic diagram of a delay stage 140 within VCO 86. Delay stage 140 includes differential amplifier 164, current source 166, and source follower buffer 168.

In the embodiment of delay stage circuitry illustrated in FIG. 5, the transistors are field effect transistors. In particular, the transistors are metal oxide semiconductor field effect transistors (MOSFETs).

The delay time of delay stage 140 is controlled by bias current $I_B$ 181. Varying $I_B$ 181 varies the delay time of delay stage 140. Bias current $I_B$ 181 is, in turn, controlled by bias voltage, $V_{BN}$ 160. The delay time of delay stage 140 is smallest when $V_{BN}$ is at its maximum level of 3.5 volts.

Another factor contributes to the relatively small delay time of delay stage 140. Unlike prior delay stages, the voltage swing of OUT and OUTB and CK and CKB is limited. This increases the frequency range of delay stage 140, allowing it to operate at higher frequencies.

Limiting the voltage swing of OUT and OUTB and CK and CKB also increases power supply rejection (PSR) by preventing transistors 186, 188 and 167 from entering deeply into their linear region of operation and keeping their output resistance relatively high.

The biasing of transistors 186 and 188 is controlled by $V_{BP}$ 162. The bias generator for $V_{BP}$ 162 (not shown) uses a simple current mirror design. More complex bias generators, which include common-mode feedback, could be used to set $V_{BP}$ 162 such that the desired voltage level is maintained at OUT and OUTB.

The voltage swing between OUT and OUTB is limited to approximately 1.5 volts peak-to-peak by transistors 190 and 192. Transistors 190 and 192 are coupled in diode fashion between OUT and OUTB, thus clamping the peak-to-peak voltage swing.

The range of possible voltage levels for OUT and OUTB is 4.5 volts to 3.0 volts. This is illustrated by the two waveforms in the upper right corner of FIG. 5. The range of voltage levels for CK and CKB is 3.3 volts to 1.8 volts. This is illustrated by the two waveforms in the lower right corner of FIG. 5.

The symmetrical shape of CK, CKB, OUT and OUTB results because $I_C$ 180 is approximately equal to $2 \times I_B$ 181. Setting the common mode voltage level of OUT and OUTB near 3.75 V prevents node 183 from going to ground. As a result, the output impedance of current source 166 remains high, keeping the VCO common mode rejection of power supply noise high.

Referring once again to FIG. 2, consider now subloops 54 and 56. Subloop 54 is a single first order loop. Subloop 56, in contrast to subloop 54, includes two first order loops. One loop is closed and is used to generate the in phase internal transmit clock, INTTCLK 62. This closed loop is essentially identical to subloop 54, varying only in its input signal and output signal. The second loop within subloop 56 operates open loop, generating the leading internal transmit clock LEADING INTTCLK 63. The amount of phase by which LEADING INTTCLK 63 leads INTTCLK 62 is fixed, but selectable, as will be described in detail below.

For simplicity's sake, subloop 54 will be described in detail first. Aided by that discussion, subloop 56 will then be described.

Subloop 54 performs phase tuning using the 12 phase signals generated by VCO 86, PH(11:0) 58. The heart of subloop 54 is phase select circuitry 120 and phase interpolator 122. Phase select circuitry 120 performs coarse phase adjustment by selecting as outputs an even phase signal and an odd phase signal from PH(11:0) 58. Even phase signals are PH0 90, PH2 94, PH4 98, PH6 102, PH8 106, and PH10 110. Odd phase signals are PH1 92, PH3 96, PH5 100, PH7 104, PH9 108, and PH11 112. Normally, the selected odd phase signal and the selected even phase signal will be adjacent to each other. For example, PH3 96 is adjacent to even phases PH2 94 and PH4 98. Phase interpolator 122 generates a signal that lies between the selected odd phase signal and the selected even phase signal. Phase interpolator 122 can generate 16 discrete values between the two selected phase signals using an even weighting signal and an odd weighting signal.

Figure 6:
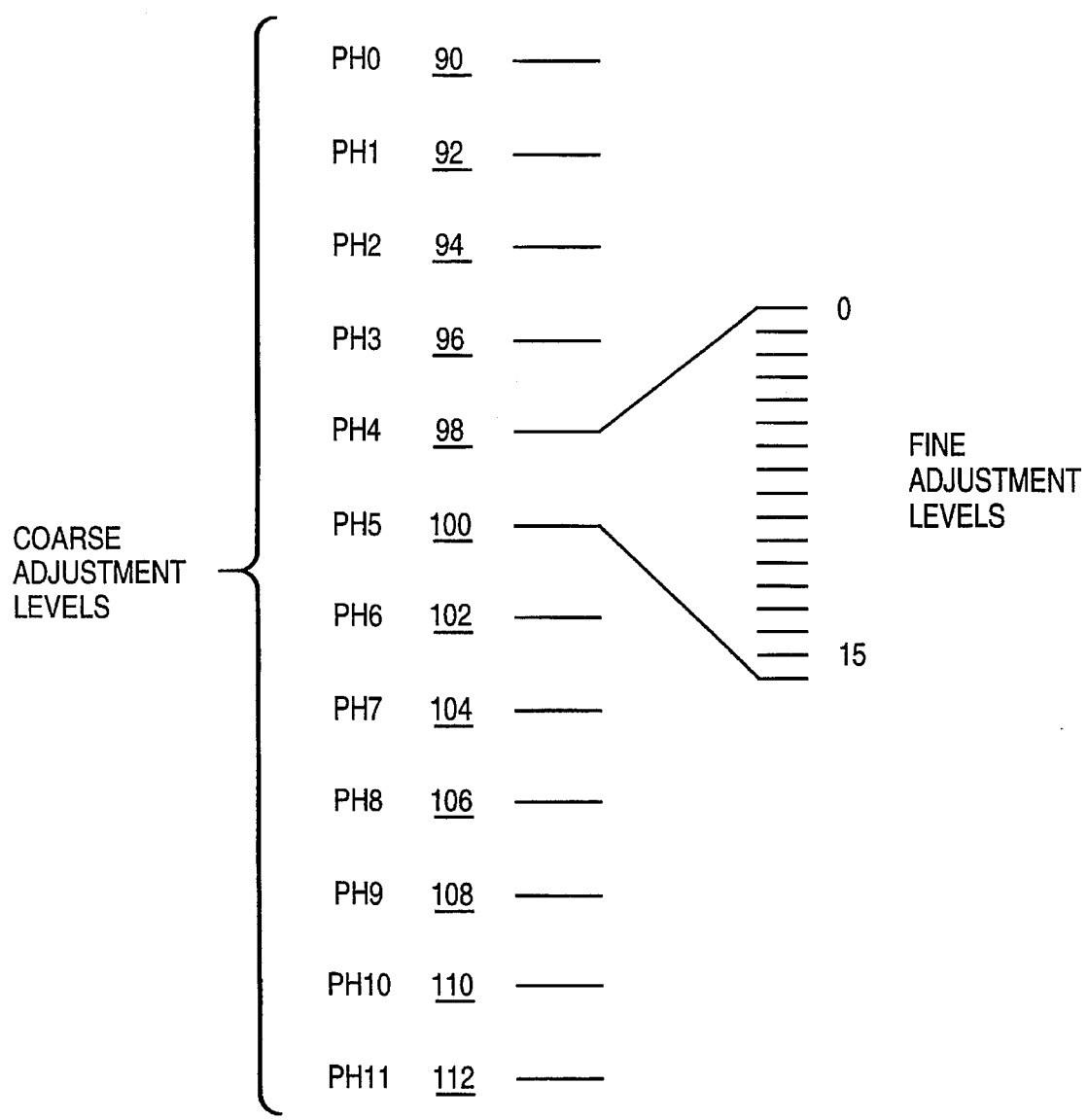
FIG. 6 is an illustration of the phase adjustment levels of the phase selection circuitry and the phase interpolator.

FIG. 6 illustrates the phase adjustment levels of phase selection circuitry 120 and phase interpolator 122. The inputs to phase select circuitry 120, PH(11:0) 58, are represented by 12 horizontal lines, which are vertically evenly spaced apart. These lines represent twelve coarse adjustment levels across the period of the external reference clock; e.g., $RCLK_S$. These twelve levels are further subdivided by phase interpolator 122, which generates 16 fine adjustment levels between each coarse adjustment level. Thus, the clock period is divided into 12×16, or 192, phase divisions.

Referring once again to FIG. 2, amplifier 124 amplifies the output of phase interpolator 122 and passes it on to clock buffer 126. Clock buffer 126 then distributes INTRCLK 60 throughout the device, 30 or 32.

Phase detector 128 compares the internal clock signal, INTTCLK 60 to the external reference, $RCLK_S$ 42, and indicates the polarity of the phase error to accumulator circuitry 130.

In one embodiment phase detector 128 is a latch. Phase detector 128 is preferably the same type of latch used by the data input circuitry of interface 34, which allows subloop 54 to compensate for the delay caused by data input circuitry. Preferably, internal receive clock, INTRCLK 60, is fedback to the latch's clock input and the reference signal, $RCLK_S$ 42, is coupled to the latch's data input. Thus, INTRCLK 60 determines the time at which $RCLK_S$ 42 Is sampled. When subloop 54 is in lock, phase detector 128 outputs a stuttering string of logical 1s and 0s. Phase detector 128 outputs a logic 1 when the low-to-high transition of INTRCLK 60 occurs before the low-to-high transition of $RCLK_S$ 42. Conversely, phase detector 125 outputs a logic 0 when the low-to-high transition of INTRCLK 60 occurs after the low-to-high transition of $RCLK_S$ 42.

Accumulator circuitry 130 uses the output of phase detector 128 to control both phase select circuitry 120 and phase interpolator 122. In other words, accumulator circuitry 130 controls both coarse and fine phase adjustment.

Figure 7:
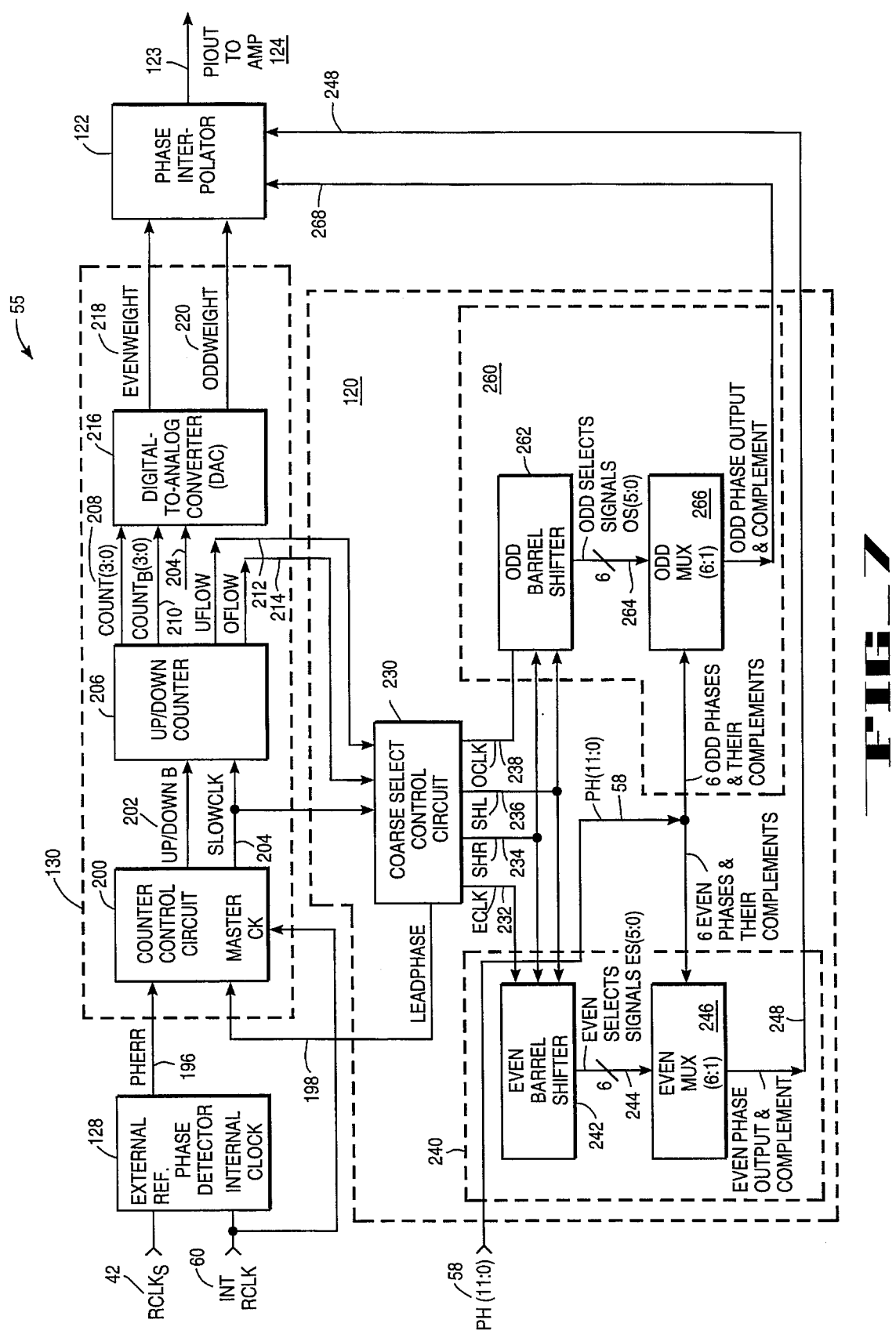
FIG. 7 is a detailed block diagram of the receive subloop within the phase locked loop.

The cooperation between accumulator circuitry 130, phase select circuitry 120, and phase interpolator 122 can be understood in greater detail with reference to FIG. 7. FIG. 7 illustrates portion 55 of subloop 54.

Accumulator circuitry 130 responds to two input signals, PHERR 196 and LEADPHASE 198. PHERR 196 is the output of phase detector 128 and as such indicates the polarity of the phase error between the internal clock and the external clock. PHERR 196 indicates that the internal clock lags the external clock with a logic 1. With a logic 0 PHERR 196 indicates the internal clock leads the external clock. LEADPHASE 198 indicates whether the leading phase signal selected by phase select circuitry 122 Is even or odd. LEADPHASE 198 is a logic 0 when the leading phase is even and a logic 1 when the leading phase is odd. For example, when phase select circuitry 122 selects PH3 and PH4 as its outputs LEADPHASE is a logic 1. LEADPHASE 198 is likewise a logic 1 when phase select circuitry 122 selects PH11 and PH0. Conversely, LEADPHASE 198 is a logic 0 when PH6 and PH7 are selected.

Counter control circuit 200 exclusively NORes PHERR 196 and LEADPHASE 198 together to generate UP/DOWNB signal 202. UP/DOWNB 202 controls up/down counter 206. When UP/DOWNB 202 is a logic 1 up/down counter 206 counts up. Up/down counter 206 counts down when UP/DOWNB 202 is a logic 0.

Counter control circuit 200 also generates an Internal clock signal 204 to synchronize the operation of subloop 54. Counter control circuit 200 divides down the clock generated by subloop 54, INTRCLK 60, to generate SLOWCLK 204. In the preferred embodiment, counter control circuit 200 divides INTRCLK 60 by 16.

Up/down counter 206 generates a number of signals, 208, 210, 212, and 214, in response to UP/DOWNB 202. These signals, 208, 210, 212, and 214, control phase select circuitry 120 and phase interpolator 122. Up/down counter 206 represents the value of its count via COUNT(3:0) 208. The sixteen levels of fine phase adjustment of phase interpolator 122 result from the resolution of COUNT(3:0) 208 and its complement, COUNTB (3:0) 210. Up/down counter 206 outputs two other signals, OFLOW 214 and UFLOW 212. Overflow signal, OFLOW 214, goes active high when up/down counter 206 is requested to increment COUNT(3:0) 208 above it maximum value; i.e., 15. Analogously, underflow signal, UFLOW 212, goes active high when up/down counter 206 is requested to decrement COUNT(3:0) 208 below it minimum value; i.e., 0. UFLOW 212 and OFLOW 214 control phase select circuitry 120.

Digital-to-analog converter (DAC) 216 converts COUNT(3:0) 208 into an analog signal to generate EVENWEIGHT 218. Similarly, COUNTB(3:0) 210 is converted into an analog signal to generate ODDWEIGHT 220. Phase interpolator 122 determines the weighting of odd and phase select signals in response to EVENWEIGHT 218 and ODDWEIGHT 220.

Phase select circuitry 120 includes coarse select control circuit 230, which controls even phase select circuit 240 and odd phase select circuit 260. Coarse select control circuit 230 clocks even phase select circuit 240 using even clock signal, ECLK 232. The operation of even phase select circuit 240 is controlled by shift right and shift left signals, SHR 234 and SHL 236. SHR 234 and SHL 236 also control odd phase select circuit 260. Coarse select control circuit 230 generates a unique clock signal, OCLK 238, to clock odd phase select circuit 260.

While tuning up or down through phases PH(11:0) 58, coarse select control circuit 230 alternately brings active OCLK 238 and ECLK 232. This alternating action derives from the alternating action of UFLOW 212 and OFLOW 214.

Figure 8:
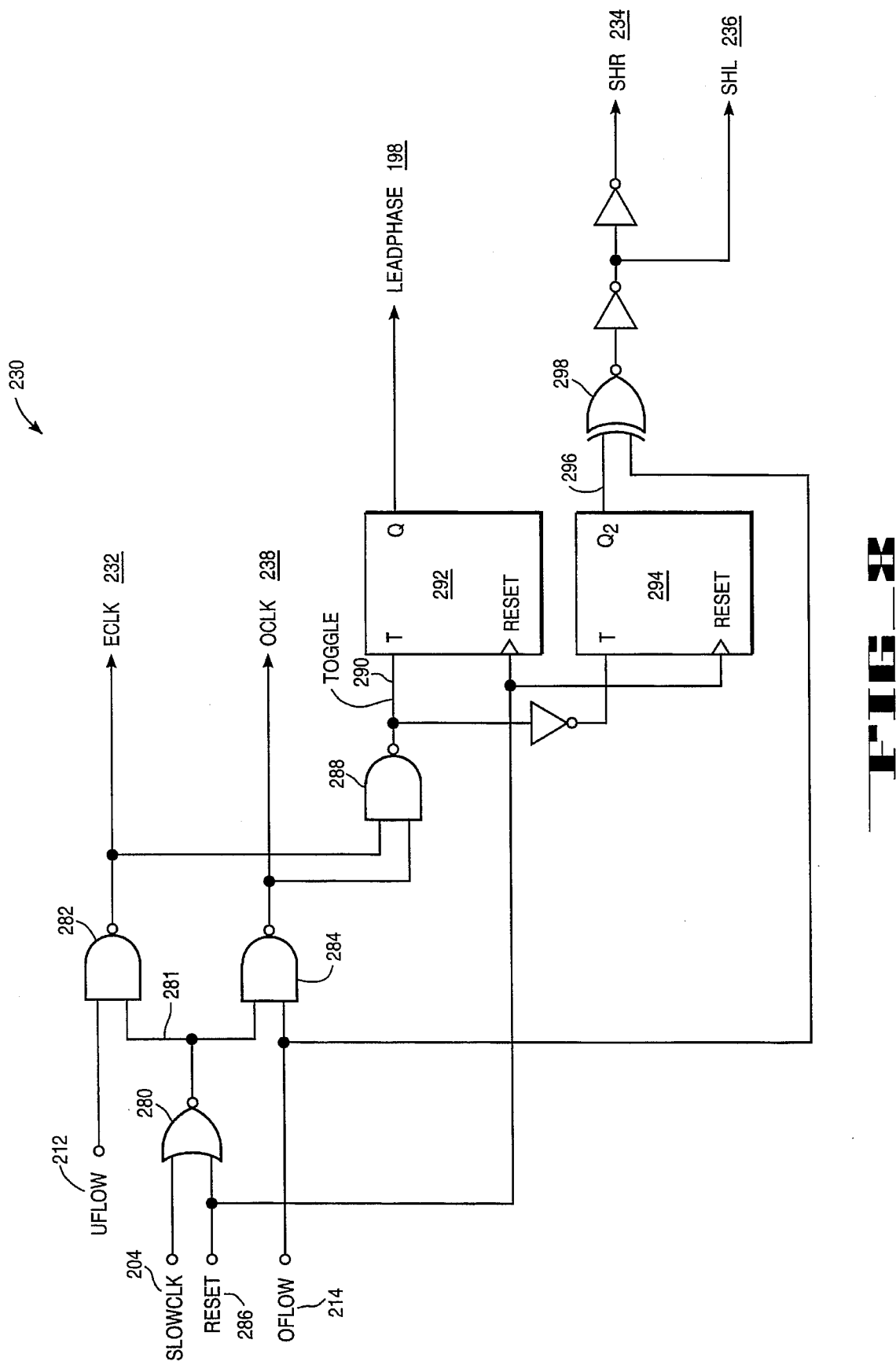
FIG. 8 is a schematic diagram of the coarse select control circuit.
Figure 5:
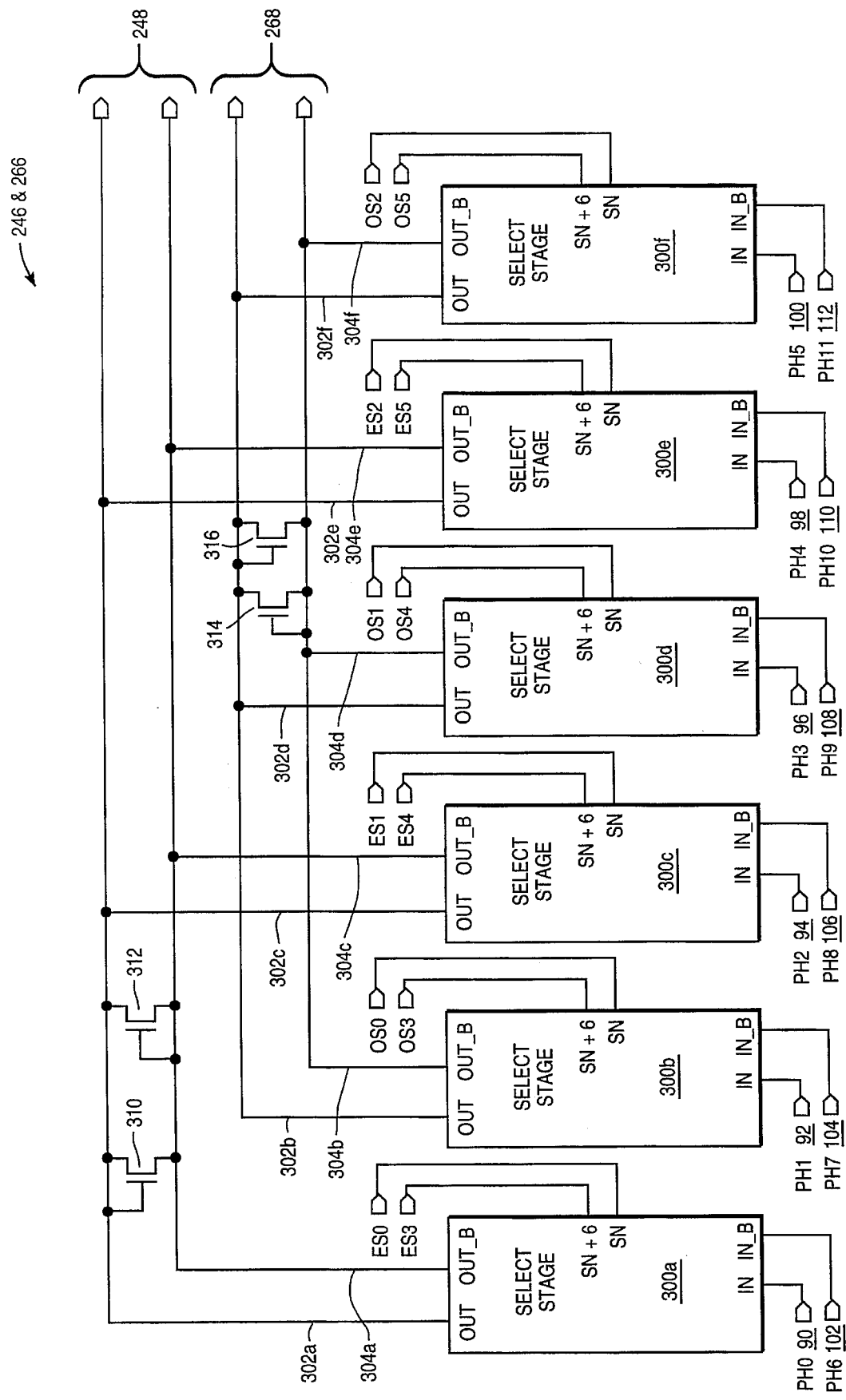

The relationship between UFLOW 212, OFLOW 214, OCLK 238, and ECLK 232 can be understood in greater detail with reference with FIG. 8. FIG. 8 illustrates coarse select control circuit 230.

Shift clocks OCLK 238 and ECLK 232 are generated using NOR gate 280, and NAND gates 282 and 284. RESET 286 and SLOWCLK 204 are NORed together by gate 280. The output of NOR gate 280, signal 281, is generally an inverted version of SLOWCLK 204, except when RESET 286 is active high. Signal 281 is coupled to gates 282. NAND gate 282 combines signal 281 and UFLOW 212 to generate ECLK 232. Similarly, NAND gate 284 combines signal 281 and OFLOW 214 to generate OCLK 238.

LEADPHASE 198, SHR 234, and SHL 236 are generated using NAND gate 288 and toggle flip-flops 290 and 292. NAND gate 288 combines OCLK 238 and ECLK 232 to generate TOGGLE 290. TOGGLE 290 is coupled to the T input of toggle flip-flop 292, which outputs LEADPHASE 198. Toggle flip-flop 292 resets LEADPHASE 198 to a logic zero when RESET 286 is active high.

TOGGLE 292 is inverted and then coupled to toggle flip-flop 294. Toggle flip-flop 294 couples its output 296 to EX-NOR gate 298, which exclusively NORes output 296 with OFLOW 214. SHL 236 is an inverted version of the output of EX-NOR gate 298 and SHR 234.

Referring again to FIG. 7, consider the influence of coarse select control circuit 230 upon circuits 240 and 260. Even phase select circuit 240 includes a barrel shifter 242 and an analog 6-to-1 multiplexer 246. Even barrel shifter 242 generates six even select signals, ES(5:0) 244, for even multiplexer 246. Even select signals 244 are digital signals. Barrel shifter 242 brings only one of the six even select signals 244 active high at a time. This is because barrel shifter 242 is initially loaded with a value of 1. Which of the six even select signals is active depends upon the previous state of barrel shifter 246 and the states of SHR 234 and SHL 236.

From its inputs 58, even multiplexer 246 selects one of the six even phase signals using even select signals, ES(5:0) 244. Even multiplexer 246 associates one even select signal with one even phase signal. As a result, even multiplexer 246 selects as even phase output signal 248 the single even phase signal associated with an active even select signal.

Like even phase select circuit 240, odd phase select circuit 260 includes a barrel shifter 262 and an analog 6:1 multiplexer 266. Odd select circuit 260 differs from even phase select circuit 240 only in its input and output signals. In other words, odd phase select circuit 260 functions like even phase select circuit 240.

FIG. 9 is a block diagram of a preferred embodiment of even multiplexer 246 and odd multiplexer 266. For simplicity's sake, the pull-up circuitry associated with multiplexer 246 and odd multiplexer 266 has been omitted. Each multiplexer 246 and 266 uses three identical multiplexer select stages 300.

Even phase multiplexer 246 includes three select stages 300a, 300c, and 300e. Each even select stage 300a, 300c and 300e receives two complementary even phase signals, and two even select signals. Using these input signals, each even select stage 300a, 300c, and 300e generate two complementary outputs, OUT 302a, 302c, and 302e and OUTB 304a, 304c, and 304e. All three OUT signals 302a, 302c, and 302e are tied together and coupled to phase interpolator 122 as the even phase output signal. Similarly, all three OUTB signals 304a, 304c, and 304e are tied together and coupled to phase interpolator 122 as the complement of the even phase output signal. To minimize propagation delay and maximize power supply rejection, the voltage swing of the even phase output signal and its complement 248 are clamped by transistors 310 and 312, which are coupled in diode fashion between the outputs of delay stages 300a, 300c, and 300e.

Odd multiplexer 266 mirrors the design of even multiplexer 246. Odd multiplexer includes three select stages 300b, 300d, and 300f. Each odd select stage 300b, 300d, and 300f receives two complementary odd phase signals, and two odd select signals. Using these input signals, each odd select stage generates two complementary outputs, OUT 302b, 302d, and 302f and OUTB 304b, 304d, and 304f. All three OUT signals 302b, 302d, and 302f are tied together and coupled to phase interpolator 122 as the odd phase output signal. Similarly, all three OUTB signals 304b, 304d, and 304f are tied together and coupled to phase interpolator 122 as the complement of the odd phase output signal. The peak-to-peak voltage swing of odd phase output signal and its complement 268 is clamped by transistors 314 and 316, which are coupled between the two signal lines in diode fashion.

Figure 10:
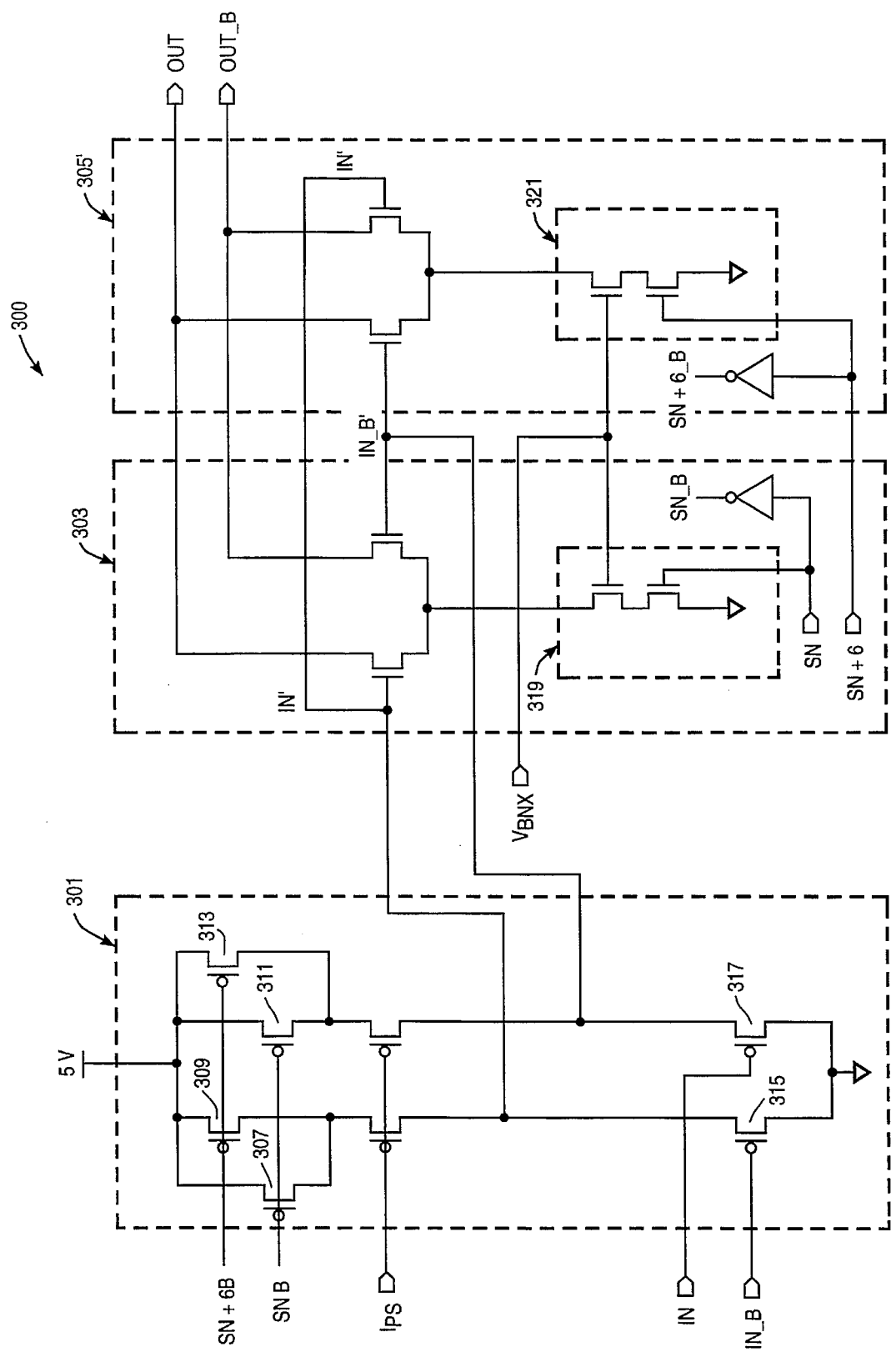
FIGS. 10 is a schematic diagram of a multiplexer select stage.

The operation of multiplexers 246 and 266 can be understood in greater detail with reference to FIG. 10. FIG. 10 illustrates schematically a single multiplexer select stage 300.

Multiplexer select stage 300 performs its function using buffering stage 301 and differential amplifiers 303 and 305. Buffering stage 301 buffers and shifts the voltage levels of input signals IN and INB. The outputs of buffering stage 301, IN' and INB', are then coupled to differential amplifiers 303 and 305. The selected differential amplifier, 303 or 305, then couples the appropriate input signals to OUT and OUTB.

The operation of multiplexer select stage 300 is controlled by the select signals coupled to SN and SN+6. The active signal of the pair of select signals, SN or SN+6, performs two functions. First, the active select signal enables buffering stage 301. Second, the active select signal turns on one of the two differential amplifiers 303 and 305.

The enabling of buffering stage 301 is achieved via four transistors 307, 309, 311, and 313 near the top of buffering stage 301. Two transistors, 307 and 309, are coupled to amplifier 315. Similarly, transistors 311 and 313 are coupled to amplifier 317. Transistors 307 and 311 are turned on and off by an inverted version of SN, SN_B. An inverted version of SN+6, SN+6_B, turns transistors 309 and 315 on and off.

Consider the operation of buffering stage 301 when one of the select inputs, SN or SN+6, is active. For example assume SN is active high. SN_B places a low voltage on the gates of transistors 307 and 311, causing them to conduct. Amplifiers 315 and 317 responds by coupling level shift versions of IN and IN_B, IN' and IN_B' to the inputs of differential amplifiers 303 and 305. Buffering stage 301 responds nearly identically to an active select signal on SN+6. In this case, transistors 309 and 313 conduct, rather than transistors 307 and 311.

Each differential amplifier 303 and 305 is controlled by a single select signal SN and SN+6. Thus, only one differential amplifier at a time drives OUT and OUT_B.

Both differential amplifiers are enabled via their current sources 319 and 321. For example, when active high, SN turns current source 319 on. Differential amplifier 303 responds by coupling IN' and OUT and IN_B' and OUTB. Similarly, active SN+6 turns on current source 321. In response, differential amplifier 305 couples IN_B' to OUT and IN' to OUT_B.

Referring yet again to FIG. 7, consider now the influence of phase selector 120 upon phase interpolator 122. Phase interpolator 122 performs fine phase tuning by interpolating between its inputs, even phase output signals 248 and odd output signals 268. The relative contribution of these input signals 248 and 268 to signal PIOUT 123 is determined by weighting signals, EVENWEIGHT 218 and ODDWEIGHT 220.

Figure 11:
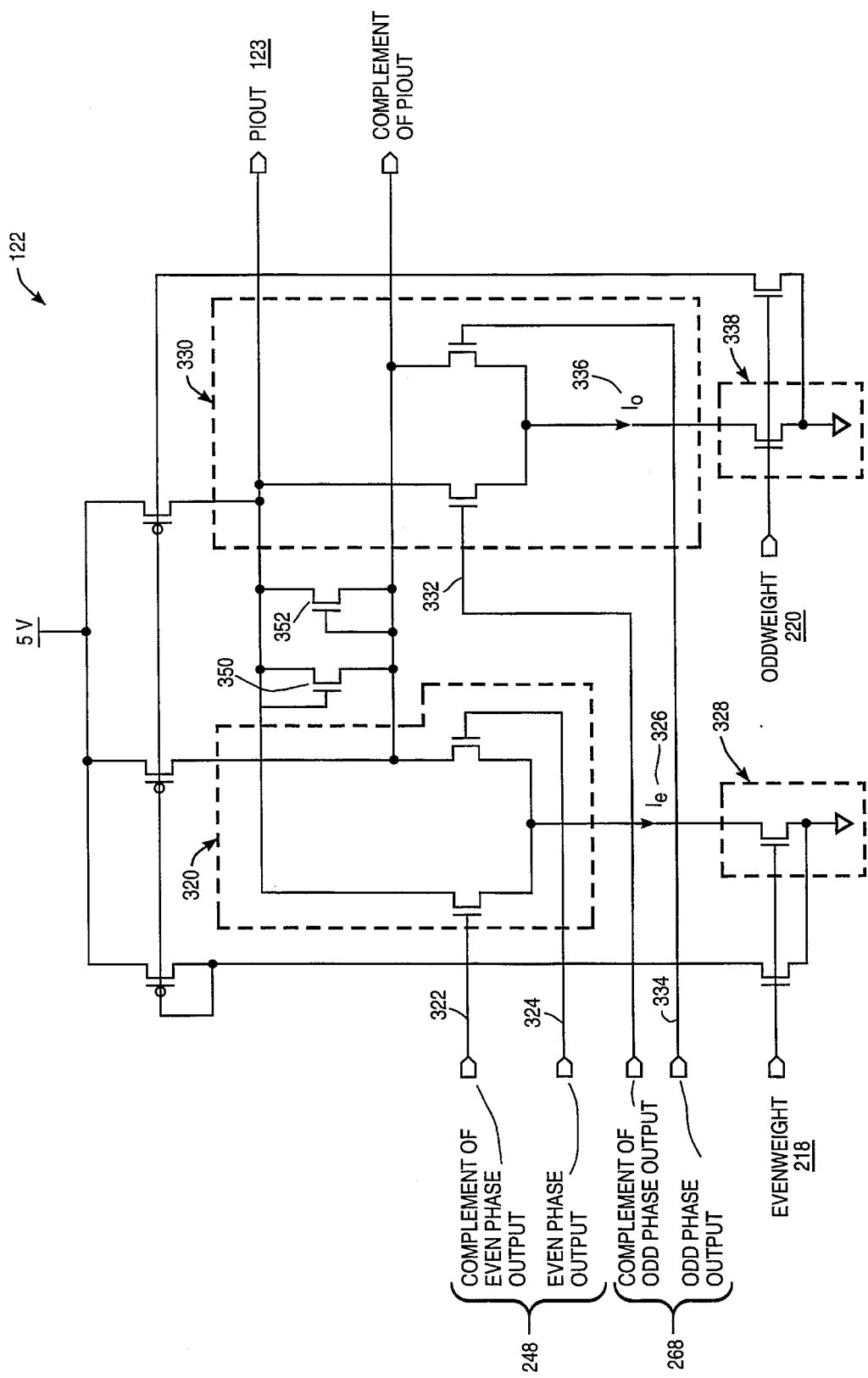
FIG. 11 is a schematic diagram of the phase interpolator.

The manner in which phase interpolator 122 generates PIOUT 123 can be understood in greater detail with reference to the schematic diagram of FIG. 11. Even phase output signal and its complement 248 are weighted by differential amplifier 320. Even phase output signal is coupled to one of the inputs 322 of differential amplifier 320, while the complement of the even phase output signal is coupled to the other input 324 of differential amplifier 320. The amplification of signals 248 is determined by $I_E$ 326, the current generated by current source 328. EVENWEIGHT 218 controls the magnitude of $I_E$ 326, thus controlling the contribution of signals 248 to PIOUT 123. As EVENWEIGHT 218 decreases in voltage level, the contribution of even phase output signals 248 to PIOUT 123 also decreases, and vice-versa.

Similarly, differential amplifier 330 weights odd phase output signals 268. One signal is coupled to input 332 and the other is coupled to input 334. The current generated by current source 338, $I_O$ 336, determines the amplification of odd phase output signals 268. ODDWEIGHT 220, the input to current source 338, controls the magnitude of $I_O$ 336 and thus the amplification of odd phase output signals 268. The amplification of odd phase output signals 268 decreases and increases directly with the voltage level of ODDWEIGHT 220.

The outputs of differential amplifiers 320 and 330 are summed together by coupling their outputs together. The peak-to-peak voltage swing of the outputs of differential amplifiers 320 and 330 are clamped by transistors 350 and 352 to minimize propagation delay and maximize power supply rejection. The voltage swings of PIOUT 123 and its complement could also be clamped by other means, such as diodes.

Figure 12:
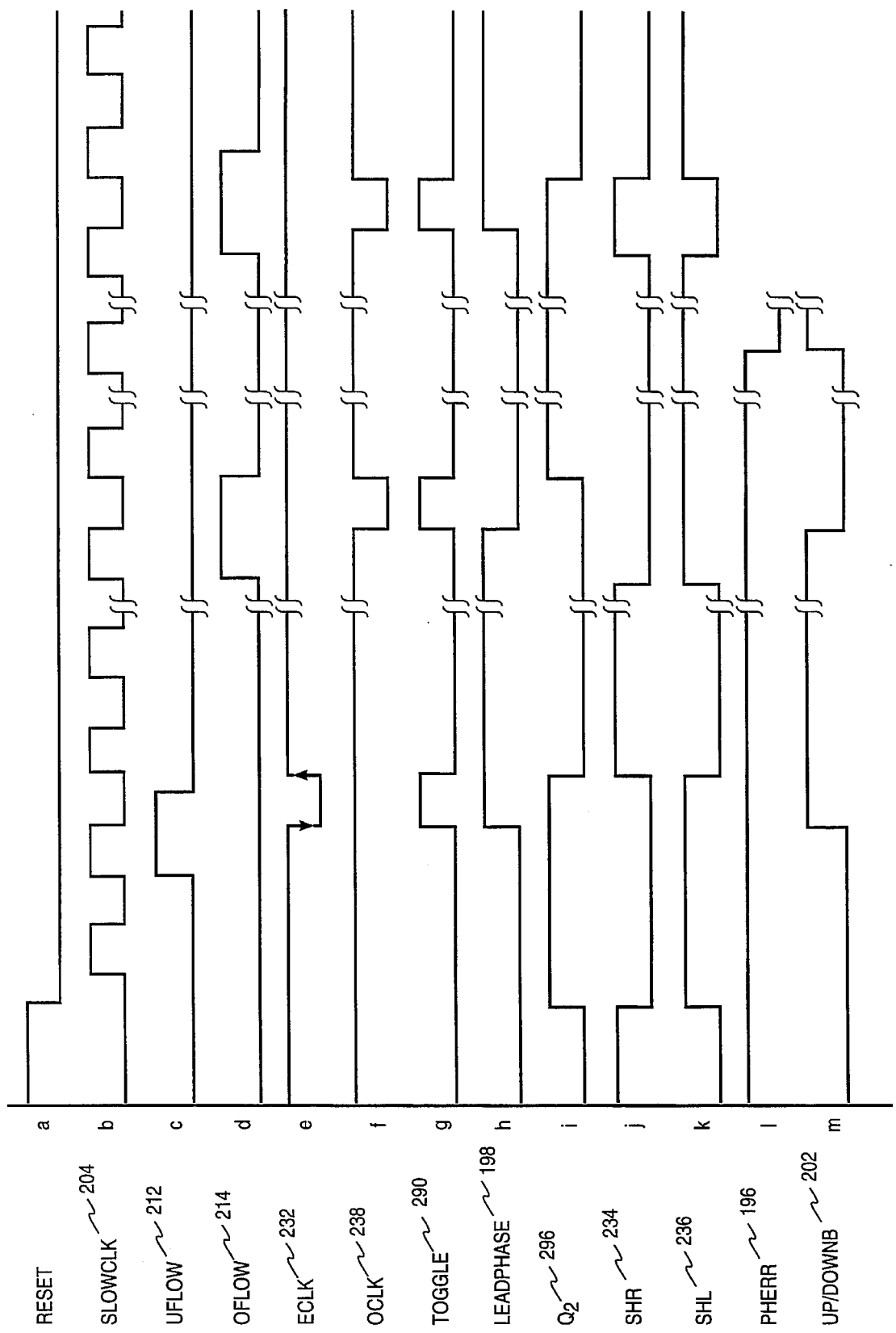
FIG. 12 is a timing diagram for a subloop of the phase locked loop.

Armed with an understanding of the architecture of subloop 54, consider its operation while locking on $RCLK_S$ 42. Assume that the phase of $RCLK_S$ 42 is initially some value between PH2 94 and PH3 96. FIG. 12 illustrates the response of subloop 54 under these circumstances.

Active RESET 286 forces even barrel shifter 242 to output a value of 000001 (binary) as even select signals, ES(5:0) 244. Even multiplexer 246 responds to ES(5:0) 244 by coupling PH0 90 and its complement, PH6 102, to phase interpolator 122. Active RESET 286 also forces odd select signals, OS(5:0) 264, to 000001 (binary). Odd multiplexer 266 responds by selecting PH1 92 and its complement, PH7 104, as its outputs 268.

Active RESET 286 may also be used to force the outputs 208, 210, 212, and 214 of up/down counter 206 to known states, though this is not necessary. If RESET 286 does not control these signals they may begin in any state upon power up. In either case, for purposes of illustration, assume that COUNT(3:0) 208 begins at 0000 (binary) and COUNTB(3:0) 210 begins at 1111 (binary). Also assume that both UFLOW 212 and OFLOW 214 start up their inactive states. Thus, EVENWEIGHT 218 is at its minimum value and ODDWEIGHT 220 is at its maximum value.

Phase interpolator 122 responds to its input signals 218, 220, 248, and 268 by bringing PIOUT 123 in-phase with PH1 92. Thus, the output of subloop 54, INTRCLK 60, is also in-phase with PH1 92.

Phase detector 128 responds to INTRCLK 60 lagging $RCLK_S$ 42 by forcing PHERR 196 to a logic 0.

Counter control circuit 200 exclusively NORes PHERR 96 with LEADPHASE 198, which has had no opportunity to change from its reset value. Active RESET 286 forces LEADPHASE 198 to a logic low. Thus, counter control circuit 200 forces UP/DOWNB 202 to a logic low.

Up/down counter 206 responds to the command to count down from UP/DOWNB 202 by underflowing; i.e., bringing underflow signal UFLOW 212 active high. The values of COUNT(3:0) 208 and COUNTB(3:0) 210 remain unchanged.

Coarse select control circuit 230 pulses active even shift clock, ECLK 232. On the active edge of ECLK 232, SHL 236 goes active high. Even barrel shifter 242 shifts left in response, forcing even select signals ES(5:0) 244 to change to 000010 (binary). Even multiplexer 246 is forced to switch its selection from PH0 90 to PH2 94 by the new value of even select signals 244.

Phase interpolator 122 is not immediately affected by the switching of even phase output signals 248. EVENWEIGHT 218 remains at its minimum value after even multiplexer 246 changes its selection, preventing even phase output signals 248 from contributing to PIOUT 123. Thus, phase interpolator 122 glitchlessly switches from an output generated by one pair of phase signals, PH0 90 and PH1 92, to an output generated by another pair of phase signals, PH1 92 and PH2 94.

It is not long the case that the even phase output signals 248 do not contribute to PIOUT 123. LEADPHASE 198 changes state with ECLK 232. LEADPHASE 198 now indicates that odd phase output signal is the lower of the two selected phase signals coupled to phase interpolator 122. Counter control circuit 200 responds to this change in LEADPHASE 198. PHERR 196 remains high, thus counter control circuit 200 forces UP/DOWNB 202 high. Up/down counter 206 begins counting up, increasing the value of COUNT(3:0) 208 and decreasing the value of COUNTB(3:0) 210. As up/down counter 206 counts up, phase interpolator 122 gradually tunes PIOUT 123 from phase alignment with PH1 92 to phase alignment with PH2 94. That occurs when COUNT(3:0) 208 reaches its maximum value of COUNTB(3:0) 210 reaches its minimum value.

INTRCLK 60, in phase with PH2 94, continues to lag RCLK$_S$ 42, which has a phase somewhere between PH2 94 and PH3 96. Phase detector 128 therefore maintains PHERR 196 at a logic 1. Consequently, counter control circuit 202 continues to request that up/down counter 206 increase COUNT(3:0) 208 until up/down counter 206 overflows, bringing OFLOW 214 active high.

Active OFLOW 214 pulses active odd shift clock, OCLK 238. On the active edge of OCLK 238, SHL 236 goes active high, forcing odd barrel shifter 262 to shift left. Odd select signals, OS(5:0) 264, select PH3 96 with a value of 000010 (binary).

The switching by odd phase output signal 268 does not affect PIOUT 123 because COUNTB(3:0) is 0000 (binary) during overflow conditions. Thus, ODDWEIGHT 220 prevents odd phase output signal 268 from contributing to PIOUT 123. Once again, phase interpolator 122 glitchlessly switches from an output generated from one pair of phase signals, PH1 92 and PH2 94, to an output generated by another pair of phase signals, PH2 94 and PH3 96.

Soon after odd multiplexer 268 changes its selection, ODDWEIGHT 220 begins to increase in value and to affect PIOUT 123. This gradual change begins when LEADPHASE 198 changes state with OCLK 238. Afterward, LEADPHASE 198 indicates that the low phase signal is even phase output signal 248. PHERR 196 remains high, thus counter control circuit 200 responds to LEADPHASE 198 by forcing UP/DOWNB 202 low. Up/down counter 206 begins counting down, decreasing the value of COUNT(3:0) 208 and increasing the value of COUNTB(3:0) 210. As up/down counter 206 counts down, phase interpolator 122 gradually tunes PIOUT 123 into near phase alignment with RCLK$_S$ 42. When that occurs, PHERR 96 stutters between a logic 1 and a logic 0. Up/down counter 206 responds by see-sawing COUNT(3:0) 208 between two consecutive binary values, and may underflow or overflow, allowing even select signals 248 and odd select signals 268 to change without causing glitches on PIOUT 123.

Subloop 54 is not only capable of turning up through PH(11:0) 58 to lock on RCLK$_S$ 42. Subloop 54 tunes down when necessary. For example, consider the situation when RCLK$_S$ 42 changes phase after subloop 54 has locked. Assume that the phase of RCLK$_S$ 42 changes from a value in between PH3 96 and PH2 94 to a value In between PH2 94 and PH1 92. FIG. 12 also illustrates the response of subloop 54 to this situation.

PHERR 198 initially indicates that INTRCLK 60 leads RCLK$_S$ 42. In other words, PHERR 198 becomes and remains a logic 0 for a relatively long period of time. Counter control logic 200 responds by directing up/down counter 206 to count up. Up/down counter 206 does so until it overflows, bringing OFLOW 214 active high while COUNT(3:0) 208 remains at 1111 (binary) and COUNTB(3:0) 210 remains at 0000 (binary).

Active OFLOW 214 pulses odd shift clock, OCLK 238, low. Active OFLOW 214 also brings SHR 234 active high and forces SHL 236 inactive low. Thus, on the active edge of OCLK 238 odd barrel shifter 262 shifts right. This changes OS(5:0) 264 from 000010 (binary) to 000001 (binary). Odd multiplexer 266 responds by deselecting PH3 96 and selecting PH1 92 as odd output signal. Again, phase interpolator 122 prevents the switching of odd output signals 268 from affecting PIOUT 123 because ODDWEIGHT 220 is at it minimum value. Subloop 54 tunes between PH2 94 and PH1 92 as necessary to lock on RCLK$_S$ 44.

Given this description of subloop 54, consider now the operation of subloop 56. Referring again to FIG. 2, the closed loop within subloop 56 closely resembles subloop 54, including phase detector 128, accumulator circuitry 130, phase select circuitry 121, in-phase phase interpolator 122c, amplifier 124, clock buffer 126, and output buffer delay compensation circuit 127. As its name implies, output buffer delay compensation circuit 127 allows subloop 56 to compensate for the delay contributed to INTTCLK 62 by the output buffers of interface 34. The open loop includes phase select circuitry 121, out-of-phase interpolator 122b, amplifier 124, and clock buffer 126.

The heart of subloop 56 is phase select circuitry 121, in-phase phase interpolator 122c, and out-of-phase interpolator 122b. Phase select circuitry 121 performs coarse phase tuning for both the open loop and the closed loop within subloop 56. Each phase interpolator 122b and 122c generates a fine-tuned signal that lies between the two pairs of phase signals coupled to it by phase selector 121. Like subloop 54, both loops with subloop 56 generate 16 fine levels of adjustment between each coarse adjustment level.

Phase select circuitry 121 gives rise to a major difference between subloop 54 and subloop 56. Unlike phase select circuitry 120, phase select circuitry 121 selects two pairs of even phase output signals and two pairs of odd phase output signals. One set of pairs of even and odd phase output signals 248 and 268 is in-phase with TCLK$_S$ 44 and are coupled to in-phase phase interpolator 122c. The other set of pairs of even and odd phase output signals 249 and 269 are out-of-phase with TCLK$_S$ 44 and are coupled to out-of-phase phase interpolator 122b.

Figure 13:
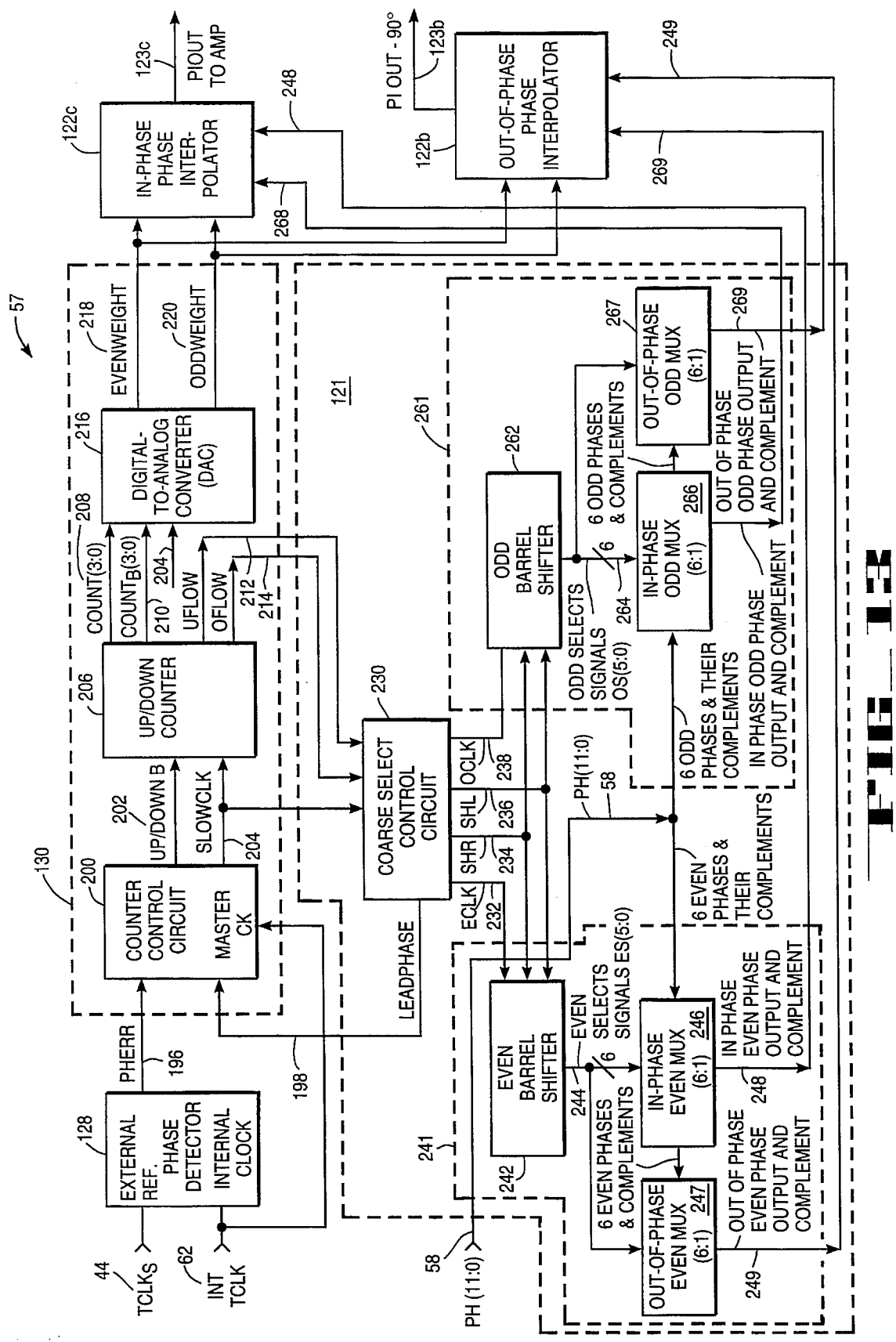
FIG. 13 is a detailed block diagram of the transmit subloop within the phase locked loop.

The cooperation of phase select circuitry 121 and phase interpolators 122b and 122c can be understood in greater detail with reference to FIG. 13. As can be seen, portion 57 closely resembles portion 55. For this reason, the following description of portion 57 focuses on its differences as compared to portion 55. Unless otherwise stated, portion 57 functions like portion 55, as described with reference to FIGS. 7–12.

The primary difference between phase select circuitry 120 and phase select circuitry 121 arises from even select circuit 241 and odd select circuit 261. Where even select circuit 240 included only one even multiplexer, even select circuit 241 includes two, in-phase even multiplexer 246 and out-ofphase even multiplexer 247. Multiplexers 246 and 247 are identical and receive identical input signals, even select signals 244 and phase signals 58. Even select signals 244 are coupled to multiplexers 246 and 247 in different fashions, however. As a result, in-phase even multiplexer 246 outputs signals 248 that are substantially in-phase with TCLK$_S$ 44, while out-of-phase multiplexer 247 outputs signals 249 that are out-of-phase with TCLK$_S$ 44.

Similar to even select circuit 241, odd select circuit 261 includes two odd multiplexers 266 and 267. In-phase odd multiplexer 266 and out-of-phase odd multiplexer 267 are, identical and receive identical input signals, odd select signals 264 and phase signals 58. These input signals 264 and 58 are coupled to multiplexers 266 and 267 in differing fashions such that in-phase odd multiplexer 266 outputs signals 268 in substantially in-phase with TCLK$_S$ 44 and out-of-phase odd multiplexer 267 outputs signals out-of-phase with TCLK$_S$ 44.

In-phase even multiplexer 246 and in-phase odd multiplexer 266 are coupled to even select signals 244, odd select signals 264, and phase signals 58 as shown in FIG. 9. The coupling of even select signals 244, odd select signals 266, and phase signals 58 is shown in FIG. 14. For simplicity's sake, the pull-up circuitry associated with multiplexer 247 and odd multiplexer 267 has been omitted. In the embodiment shown, out-of-phase even phase output signals 249 and out-of-phase odd phase output signals 269 lead their in-phase counterparts 248 and 268 by substantially 90°. This phase shift in the out-of-phase multiplexer is achieved by associating each select signal with a phase signal 58 that leads by 90° the phase signal associated with that same select signal in the corresponding in-phase multiplexer. For example, in in-phase even multiplexer 246 even select signal ES0 selects phase signal PH0 90. In contrast, out-of-phase even multiplexer 247 selects PH9 108 using ES0. Analogously, while OS3 is used to select PH7 in in-phase odd multiplexer 266, OS3 is used to select PH4 98 in out-of-phase odd multiplexer 267.

The degree of phase shift between signals 248 and 249, and 268 and 269, may be arbitrarily selected in other embodiments simply by altering which select signal selects which phase signal in out-of-phase multiplexers 247 and 267.

Out-of-phase phase interpolator 122$b$ uses the outputs of out-of-phase multiplexers 247 and 267 to generate PIOUT-90° 123$b$. Out-of-phase interpolator 122$b$ also responds to EVENWEIGHT 218 and ODDWEIGHT 220, as discussed with respect to FIGS. 7–12.

Thus, circuitry for performing fine phase adjustment within a phase locked loop has been described. The phase selector selects an even phase signal and an odd phase signal from the twelve phase signals output by the VCO. The even and odd phase signals are selected by an even select signal and an odd select signal, respectively. The phase interpolator interpolates between the even phase signal and the odd phase signal to generate an output signal. The affect of each phase input signal on the output signal is determined by an even weighting signal and an odd weighting signal, respectively. Together, the weighting signals and the switching mechanisms of the phase select circuitry prevent glitches from appearing on the output signal when either the even phase signal or the odd phase signal is switching.

A method of performing fine phase adjustment in a phase locked loop has also been described. First, two phase signals are selected from a multiplicity of phase signals. The two phase signals are selected by a select signal. Next, an output signal is generated by interpolating between the two phase signals. The contribution of each of the two phase signals to the output signal is determined by a weighting signal. The weighting signals prevent glitches from appearing on the output signal when either the even phase signal or the odd phase signal is switching.

Finally, a delay stage for a ring oscillator has also been described. Each delay stage includes a differential amplifier, which generates two complementary output signals. Coupled between the complementary output signals, two voltage clamping means limit the peak-to-peak voltage swing of the output signal. Limiting the peak-to-peak voltage swing of the output signal speeds-up the delay stage and allows the ring oscillator to include a greater number of delay stages; and increases the power supply rejection of the oscillator.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A ring oscillator comprising:
    an even-numbered plurality of ring coupled delay stages, each delay stage comprising:
    (A) a differential amplifier for generating a first output signal at a first node and a second output signal complementary to the first output signal at a second node, wherein the differential amplifier further comprises:
        (i) a first metal oxide semiconductor field effect transistor (MOSFET) of a first type coupled between the first node and a first potential source;
        (ii) a second MOSFET of the first type coupled between the second node and the first potential source, wherein the first and second MOSFETs of the first type are biased by an output level biasing voltage;
        (iii) a first MOSFET of a second type coupled to the first node and a third node, wherein the first MOSFET of the second type receives a first input signal;
        (iv) a second MOSFET of the second type coupled to the second node and the third node, wherein the second MOSFET of the second type receives a second input signal;
    (B) a voltage clamping circuit comprising:
        (i) a first diode-coupled MOSFET; and
        (ii) a second diode-coupled MOSFET, wherein the first and second diode-coupled MOSFETs are cross-coupled between the first and second nodes to limit a peak-to-peak voltage swing of each of the first and second output signals; and
    (C) a current source coupled between the third node and a second potential source, the current source varying a bias current through the current source in accordance with a delay bias voltage.

2. The ring oscillator of claim 1, wherein the current source further comprises a third MOSFET of the second type.

3. The ring oscillator of claim 1 wherein the first type is N-type and the second type is P-type.

4. The ring oscillator of claim 1 wherein the first type is P-type and the second type is N-type.

\* \* \* \* \*